(12) United States Patent
Pool

(10) Patent No.: US 7,675,092 B2
(45) Date of Patent: Mar. 9, 2010

(54) RADIATION TOLERANT CCD STRUCTURE

(75) Inventor: Peter James Pool, Chelmsford (GB)

(73) Assignee: E2V Technologies (UK) Limited, Essex (GB)

( * ) Notice: Subject to any disclaimer, the term of this patent is extended or adjusted under 35 U.S.C. 154(b) by 596 days.

(21) Appl. No.: 10/593,328

(22) PCT Filed: Mar. 16, 2005

(86) PCT No.: PCT/GB2005/001005

§ 371 (c)(1),
(2), (4) Date: Sep. 18, 2006

(87) PCT Pub. No.: WO2005/091623

PCT Pub. Date: Sep. 29, 2005

(65) Prior Publication Data

US 2007/0194351 A1     Aug. 23, 2007

(30) Foreign Application Priority Data

Mar. 18, 2004  (GB)  ................................. 0406120.6

(51) Int. Cl.
H01L 29/768 (2006.01)
(52) U.S. Cl. .................................................. 257/222
(58) Field of Classification Search ................. 257/215, 257/216, 222, 249, E27.153, E27.154, E31.075, 257/E31.078, E21.081, E21.083
See application file for complete search history.

(56) References Cited

U.S. PATENT DOCUMENTS

| 4,185,292 | A |   | 1/1980  | Nelson |
|-----------|---|---|---------|--------|
| 4,199,691 | A | * | 4/1980  | Angle .......................... 377/63 |
| 4,380,056 | A | * | 4/1983  | Parrish et al. ................ 365/183 |
| 5,134,087 | A |   | 7/1992  | Hynecek et al. |
| 5,576,561 | A |   | 11/1996 | Colella et al. |
| 5,900,654 | A |   | 5/1999  | Spratt et al. |
| 5,972,733 | A |   | 10/1999 | Hynecek et al. |

(Continued)

FOREIGN PATENT DOCUMENTS

EP     0 872 897 A     10/1998

(Continued)

OTHER PUBLICATIONS

International Search Report dated Jun. 27, 200, issued in PCT/GB2005/001005.

(Continued)

*Primary Examiner*—Thomas L Dickey
*Assistant Examiner*—Nikolay Yushin
(74) *Attorney, Agent, or Firm*—Venable LLP; Robert Kinberg; Robert S. Babayi

(57) ABSTRACT

A CCD structure (20) tolerant to the adverse formation of traps resulting from exposure to irradiation by particles such as protons and neutrons is described. The CCD comprises an image plane (22) having a number of parallel transfer channels. Path defining structures (24), such as barrier implants, define a principal electron flow path through the channel, and define a number of secondary paths which converge on the principal path. The paths ensure that signal charge generated across the entire width of the channel is collected together into regions of smaller area so that the likelihood of interaction with traps is reduced, and charge containment is maintained near the optimum for all signal levels up to the full well.

12 Claims, 3 Drawing Sheets

U.S. PATENT DOCUMENTS

| | | | |
|---|---|---|---|
| 6,207,981 B1 * | 3/2001 | Hatano et al. | 257/221 |
| 6,608,337 B2 | 8/2003 | Hynecek | |
| 2002/0191093 A1 * | 12/2002 | Hynecek | 348/311 |
| 2003/0042510 A1 * | 3/2003 | Banghart et al. | 257/223 |

FOREIGN PATENT DOCUMENTS

| | | | |
|---|---|---|---|
| GB | 2324197 | * | 10/1998 |
| GB | 2 395 068 A | | 5/2004 |
| JP | 2003-243644 | | 8/2003 |

OTHER PUBLICATIONS

United Kingdom Search Report issued in Application No. GB0406120.0, dated Nov. 17, 2004.

* cited by examiner

Electron Potential II-II

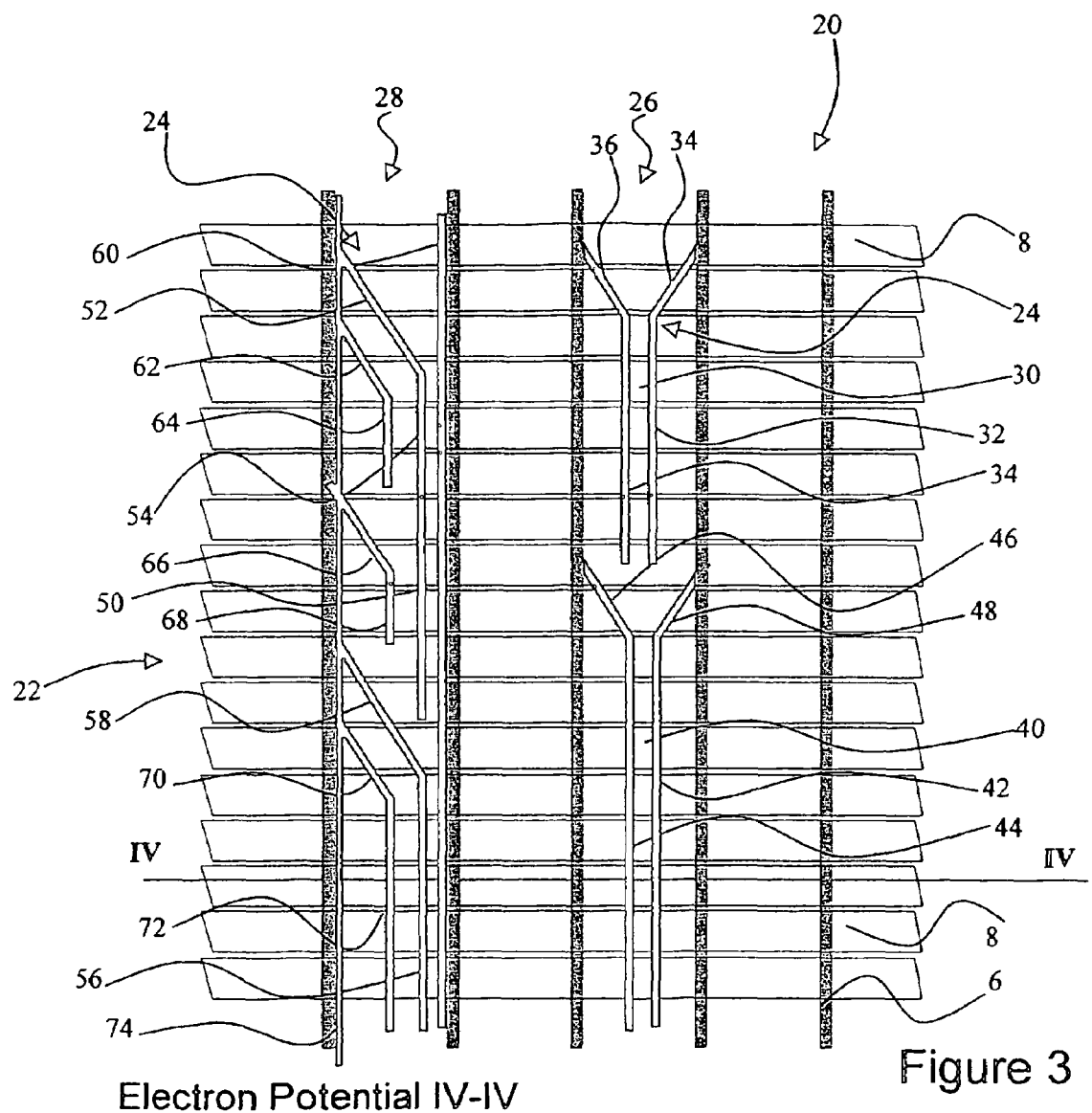
Electron Potential IV-IV
Figure 3
Figure 4

RADIATION TOLERANT CCD STRUCTURE

CROSS-REFERENCE TO RELATED APPLICATIONS

This application is a National Phase of International Application No. PCT/GB2005/001005, filed Mar. 16, 2005, designating the United States and claiming priority from Application No. 0406120.6, filed in Great Britain on Mar. 18, 2004.

This invention relates to a charge coupled device (CCD), and in particular to a CCD which is tolerant to particular kinds of radiation.

CCD's are used in a variety of applications such as digital still and video cameras, astronomical imaging equipment, and barcode readers. A CCD is a light sensitive integrated circuit having an imaging plane on which incident radiation from an image is allowed to fall. Photons from the image are converted into electrical charge in the image plane, and the spatial arrangement of the imaging plane is configured to have areas corresponding to pixels of a resulting image. The electrical charge formed is then clocked using an arrangement of electrodes into processing circuitry. In most applications, the electrical charge is processed so as to produce an image for display on a screen.

For a CCD to have a useful charge transfer efficiency, it is necessary that it be built with a buried channel. As is known in the art, the imaging plane in an n-channel CCD, in which the electric charge carriers are electrons, is typically formed using a p-type silicon wafer, doped with an impurity such as boron, with a shallow phosphorus implant, producing an n-type buried channel. Conversely, in a p-channel CCD the charge carriers are holes, and the imaging plane is formed using an n-type silicon wafer, often doped with phosphorus, with a p-type buried channel produced by implantation of boron.

Problems with the operation of the CCD may however occur if it is exposed to radiation consisting of particles, such as protons or neutrons. This is a particularly likely problem for CCDs deployed in space. Irradiation of the silicon device with protons or neutrons may result in the ejection of silicon atoms from the lattice, forming vacancy/interstitial pairs. These have sufficient mobility in the lattice that some can form complexes with each other (e.g. vacancy—vacancy pairs) or with impurities such as boron, oxygen, carbon or phosphorus.

In a CCD, if any of these complexes gives rise to an energy state near the middle of the silicon band-gap, carriers can be temporarily held in this localised state and be released after the remainder of the signal, with which it had been associated, has been transferred to another pixel. This is seen as a reduction in charge transfer efficiency (CTE) of the device, and the complex is known as a trap.

A number of trap types can be generated, some being more troublesome than others, depending primarily on the probability of interaction and the time constant for carrier release at the temperature of device operation. For example, a vacancy—phosphorus complex (also known as an e-centre) is a well known trap which is responsible for a large proportion of the transfer efficiency loss in n-channel CCD's. p-channel CCD's have much less phosphorus and have been shown to suffer less CTE degradation by proton/neutron irradiation. However, all CCD's suffer some CTE degradation from a proton/neutron irradiation, which limits their applicability in such environments.

A device structure has been developed, and is well known, which ameliorates degradation of the CTE providing the signal is always very small. However, for certain sizes of signal we have found that this device can actually result in the effect being worse. We have appreciated therefore that there is a need for an improved CCD design in which impairment of the CTE due to proton or neutron radiation is limited over a wide range of signal sizes.

The invention is defined in the independent claims to which reference should now be made. Advantageous features are set forth in the dependent claims. A CCD structure tolerant to the adverse formation of traps resulting from exposure to irradiation by particles such as protons and neutrons is therefore provided by the invention. The path defining structures 24, such as barrier implants, define a principal electron flow path through the channels of the CCD, and define a number of secondary paths, which converge on the principal path. The paths ensure that signal charge generated across the entire width of the channel is collected together into regions of smaller area so that the likelihood of interaction with traps is reduced, and charge containment is maintained near the optimum for all signal levels up to the full well.

A preferred embodiment of the invention will be described in more detail, by way of example, and with reference to the drawings in which:

FIG. 3 is an illustration of the preferred embodiment of the invention;

FIG. 4 is an illustration of the electron potential across the channels of the CCD in the preferred embodiment;

Figure 1:
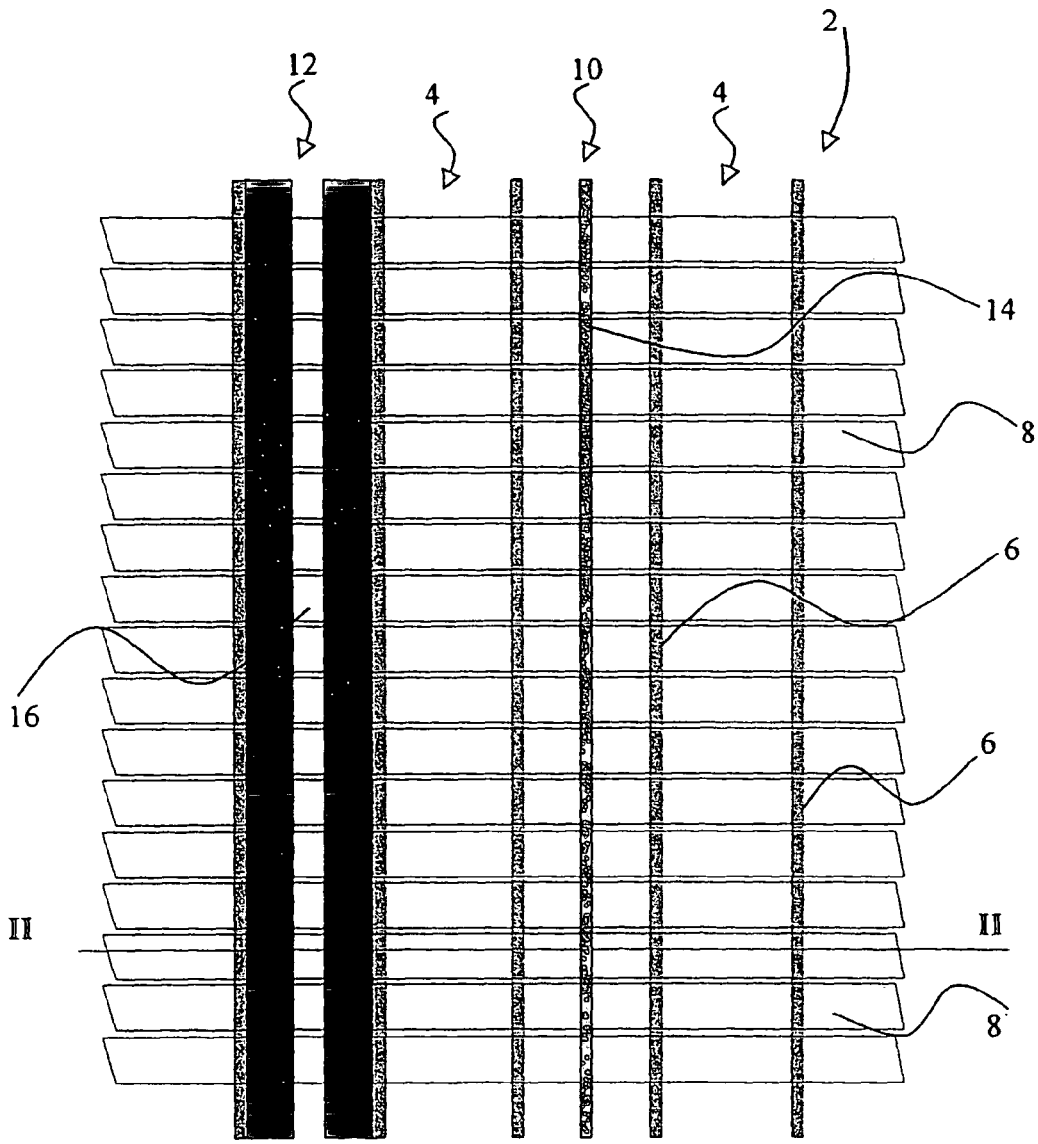
FIG. 1 is an illustration of a known CCD structure developed to limit radiation induced degradation of the CTE.
Figure 2:
FIG. 2 is an illustration of the electron potential across the channels of the CCD shown in FIG. 1.

The image plane of a known CCD 2 is shown in FIG. 1 to which reference should now be made. In an n-channel device, electrons are constrained to move within a number of parallel transfer channels 4 by column isolation structures 6. The column isolation structures are formed by doping the silicon wafer so that a potential barrier is formed in the appropriate location to define a channel wall. The electron potentials corresponding to the channel walls are shown in FIG. 2 schematically as a periodic series of peaks.

The movement of the electrons in the channels is produced by appropriate clocking of the potential on a series of polysilicon electrodes 8. In FIG. 1, the direction of transfer of the electron charge packets is taken to be down the page.

Damage to the silicon lattice by protons or neutrons or other damaging particles gives rise to an increase in the density of traps in the transfer path of the channel. The consequence of this is a degradation of electron transfer efficiency. As mentioned above, this is well known, particularly in the provision of CCD's for space applications where proton irradiation is frequently encountered.

Channels 10 and 12 respectively show two known structures, developed particularly for X-ray imaging spectroscopy applications, designed to limit the adverse effect of trap production in the channel. A narrow additional channel 14, 16 is provided within the main transfer channels 10, 12. As shown in channel 10, this can be produced by additional buried channel doping of phosphorus atoms, or, as shown in channel 12, by partial compensation of buried channel doping, through counter doping with boron. The corresponding graphs of electron potential are shown schematically in FIG. 2 for both of these channels, taken along line II-II of FIG. 1.

The narrow channel 14, 16 produced in this way is known variously as a notch, supplementary buried channel or minichannel, but for convenience in this document, shall be referred to solely as a notch. The notch constrains small charge packets to a reduced volume of silicon while being transferred, reducing the probability of coming into contact with traps. This structure does, however, reduce the charge handling capacity. The defined width of notch is usually about 3 to 4 µm and the improvement resulting from its inclusion relates to the ratio of the main channel width to that of the notch. It therefore gives greater benefit in a wide (e.g. greater than 25 µm wide say) main channel. A notch typically has a depth defined by a potential of about 2V.

The scheme described has been demonstrated to be very effective for the small charge packets which are typical of X-ray imaging spectroscopy. However, when applied to images with a greater dynamic range, the charge packet can be too great to be accommodated in the narrow channel 14, 16. When this occurs and the channel overfills, the consequent re-distribution of charge in the area outside the notch results in observed CTE, which is at least as low as would have been the case if no notch had been employed. Analysis indicates that there is a consequent reduction in charge transfer efficiency to a level lower than would have been the case without the notch. This effect would be particularly acute for devices with a wide main channel i.e. those which gained most benefit from the presence of the notch while signal levels were small.

A preferred embodiment of the invention will now be described with reference to FIG. 3. FIG. 3 shows a preferred CCD 20 having a parallel channel transfer arrangement 22 forming an image plane. The structure and operation of this device is similar to that shown in FIG. 1. Light radiation incident on the image plane results in the production of signal electrons, which are clocked via polysilicon electrons 8 towards processing circuitry down the page. The processing circuitry is not shown. Any protons or neutrons incident on the image plane may result in traps being formed in the channels, thereby lowering the charge transfer efficiency of the device.

In order to alleviate this problem, the preferred embodiment comprises barrier implant regions 24 to define a number of electron flow paths, which both constrain the charge to a smaller channel area and guide the movement of charge through the channel. It will be appreciated that the implant regions may be implemented such that either potential barriers or potential wells are formed in the channel. The preferred shape of these potentials will be described in more detail later.

Two different topographies of path-defining structures, in this case barrier implants, will be described. One is shown schematically in channel 26 of the CCD, and the other is shown schematically in channel 28. The corresponding graphs of electron potential are shown schematically in FIG. 4 for both of these channels, taken along line IV-IV of FIG. 2. In practice, each channel of the CCD is preferably provided with one of the two topographies.

The first preferred barrier implant topography, shown in column 26, comprises first and second barrier implants extending substantially symmetrically from either side of the channel. Before they reach the centre of the channel however, they turn and continue parallel to the channel sides for the length of several electrodes before terminating. A narrow notch-like path 30 is therefore defined between the two parallel sections 32 and 34, similar to the notch shown in channels 10 and 12 in FIG. 1. Signal electrons from the entire width of the channel are collected and fed into the notch-like path 30 by means of the angled sections 36 and 38 which cause tapering of the effective channel width just before the notch.

Further along the channel 26 in the direction in which the signal electrons are clocked is a substantially identical barrier implant structure comprising opposing parallel sections 42 and 44 defining a notch-like path 40, and angled sections 46 and 48 which define a taper in the channel width leading into the notch-like path. The signal electrons output from the end of the first notch-like path 30 are fed directly into the tapering section at the opening of the second notch-like path 40. The signal charge is therefore constrained to move down a narrow path in the centre of the channel, much like in the known prior art arrangement. This notch-like path 30 and 40 forms the principal path for charge flow through the channel.

Additionally however, signal electrons that are produced outside of the narrow notch-like path 30, that is between the parallel sections 32 and 34 and the channel walls, will be collected together by the angled sections 46 and 48 and fed into the second notch-like path 40. These regions therefore form secondary electron flow paths which converge on the principal path. Thus, signal charge from the whole channel width is successively collected together and caused to flow in a narrow path in the centre of the channel, reducing the likelihood of interaction with any traps formed in the silicon lattice.

A second preferred barrier implant topography is shown in channel 28 of FIG. 3. Instead of a central path, this topography relies on collecting the signal electrons into a notch-like path 50 adjacent the channel wall 6. The path 50 forms the principal path through the channel.

An angled barrier implant 52 therefore extends from one wall of the channel, across the greater part of the channel width before extending, as section 54, parallel to the channel wall 6. This topography, is repeated further along the channel in the direction of movement of the signal electrons in angled barrier implant 58, and parallel barrier implant 56. A continuous, parallel barrier implant 60 is also formed directly adjacent the channel wall. This is optional, but its inclusion results in a symmetric potential profile of the resulting notch-like path which makes the operation of the device easier to predict.

Additional barrier implants are also provided to divide the channel area between the parallel barrier implant and the furthest channel wall, that is the wall not adjacent the parallel barrier implant 60, into a plurality of secondary electron flow paths. These implants take the form of secondary angled sections 62, 66, 70 and secondary parallel sections 64, 68, 72 which respectively define a path between themselves and the first angled 52, 56 and parallel sections 54, 58, and between themselves and the channel wall 6.

Signal charge in the path furthest from the notch-like path 50 and adjacent the channel wall is quickly directed into the secondary path formed between the barrier implants 54, 62, which in turn is then directed into the principal notch-like path 50. The converging branching structure of this barrier topography means that charge from the entire width of the channel is collected more quickly and shunted into paths of narrow width where the electron density is increased.

The first barrier topography shown in channel 26 is similar to that shown in channel 16 except that it results in less reduction of well capacity. It does not however constrain the charge to as small an area as the structure of channel 28, when the notch is over-filled. It will be appreciated that the ideal transfer channel for resistance to proton radiation damage should constrain the charge to the minimum possible volume for all charge levels, and that the channel 28 structure is a step approximation to that.

It is understood that where a constriction exists in a transfer channel, a tendency exists for a retarding potential to be generated. In the detail of the tapering of channels, the tapering is preferably achieved as a series of small tapers, placed in the high transfer field region where two adjacent transfer electrodes are close to each other, as understood in the art.

The preferred barrier implant topography therefore defines a number of transfers in straight channels or paths before the junction structure, at which any charge which has been collected across the width of the main channel is added in to the narrower channels. At higher signal levels, excess charge will spill from the narrowest channel into the next channel. At still higher signal levels the charge will also spill from the second channel into the third, but is not expected that these spilling processes will reduce transfer efficiency.

The lengths of the straight portions of channel will require different optimisation for different applications, but are likely to be around 100 transfer elements. The number of channels could be increased above the three shown in column 26 and 28.

It will also be appreciated that although, FIG. 3 shows only two path defining structures in each channel, the path defining structures are preferably repeated along the entire length of the channel.

Similar structures can be included in the serial transfer channel but, in this case, a series of parallel notches would suffice since, when charge is transferred into the serial register, it will spill to fill an appropriate number of notches and no more charge will be added. This results charge being constrained to the minimum channel width required to transfer the charge. Of course, as with both serial and parallel transfer registers, it will be understood that the amount of charge that can be carried by a notch is a function of the width of the notch and the depth.

Additionally, although only in the embodiments described the channel width has been divided into approximately three adjacent channels, it might be advantageous to provide a much greater number, as many as can realistically be accommodated, in order to obtain a closer step approximation to the case where the minimum channel area is used.

Although, the preferred embodiment has been described with reference to a number of compensating barrier implants similar to those in channel 16 of FIG. 1, it should be noted that a structure with similar functionality could be built using additional buried channel implants, similar to that in channel 14 of FIG. 1.

Figure 5:
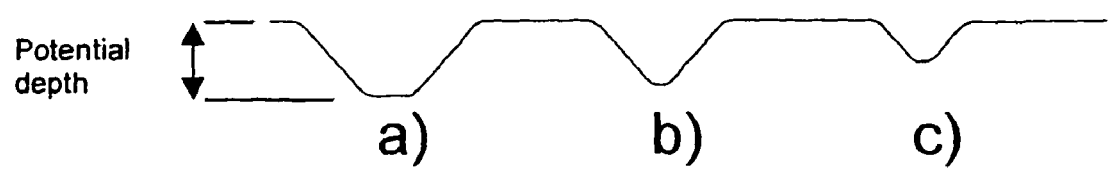
FIG. 5 is an illustration showing notch profiles.

The shape of the potential well or potential barrier used to form the notch is preferably optimised to further reduce the effect of traps on the CTE in the device. FIG. 5 schematically shows the electron potential profile of notches of different widths. As shown, it will be appreciated that the potential profile of a notch has sloping sides, as a result of fringing fields in the silicon. As a result, the potential depth of the notch is defined by the implantation dose, provided the width of the notch is sufficient for a region to remain which is substantially not affected by fringing fields. Further reduction of the defined width of the notch can lead to a reduction of depth, as shown. This is undesirable since, perturbations in the width of the notch result in perturbations in depth, which will impede charge transfer.

However, a V-shaped potential profile ensures that whatever charge level is contained in the notch, is contained in a minimum volume, at the narrow region of the V. The preferred width of the notch used in the preferred embodiment is, therefore, that width for which the notch just maintains full depth, as shown in b) of FIG. 5.

Conventional notches are typically implemented with a potential depth of approximately 2V, which is high enough to limit thermal emission of carriers from the notch but low enough to minimise charge capacity losses. For this potential depth, the preferred width is therefore in the region of 3 to 4 μm.

For the structure of the preferred embodiment, there is however, greater freedom in the design of the notch, since its presence causes less degradation of well capacity. If the notches are formed by compensating barrier implants then it is preferred if the barrier separating the notches may be made higher than usual, which would allow the notch to be made wider but maintain a V shape and hence maximum charge density storage for the increased charge capacity.

Figure 6:
FIG. 6 is an illustration showing barrier profiles.

FIG. 6 shows schematically the electron potential profile of potential barriers. With reference to FIG. 6, it will be appreciated that the shape and height of the barrier is also affected by fringing fields. This allows the defined width of the barrier to be optimised for the intended height, in the same way as described above.

The heights, widths and numbers of barriers or notches will require individual optimisation for particular applications, trading efficiency in protecting against CTE degradation against control of charge handling capability. The best length of straight sections of notch between junction structures will, for example, depend on the operating temperature and transfer speed.

It will be appreciated that a number of modifications to the preferred embodiment may be made. One such example is the inclusion of an anti-blooming structure 74. In the barrier implant topography of column 28, this would take the form of an additional implant preferably located adjacent the channel wall opposite the principal notch-like channel.

The invention claimed is:

1. A CCD imager of the type having an image area in which charge is generated and clocked to an output, comprising an image area divided into a plurality of parallel channels by channel walls, at least some of the parallel channels being further divided by path defining structures to create at least a principal path and one or more secondary paths; the principal and one or more secondary paths being arranged such that charge overflowing from the principal path during charge transfer is retained within the one or more secondary paths before the channel walls.

2. A CCD imager according to claim 1, wherein the secondary paths are arranged to converge on the principal path.

3. A CCD imager according to claim 1, wherein the principal path is defined at one side of a parallel channel.

4. A CCD imager according to claim 1, wherein, the principal path is defined in the middle of a parallel channel.

5. A CCD imager according to claim 1, wherein the width of a parallel channel is divided into the principal path and two or more secondary paths.

6. A CCD imager according to claim 1, wherein the path defining structures allow signal charge above a predetermined amount to spill from either the principal path or a secondary path into an adjacent secondary path.

7. A CCD imager according to claim 1, wherein the path defining structures comprise compensating barrier implants.

8. A CCD imager according to claim 1, wherein the path defining structures comprise additional buried channel implants.

9. A CCD imager according to claim 1, wherein the path has a V-shaped potential profile.

10. A CCD imager according to claim 1, wherein the principal path is through a parallel channel and the one or more secondary paths are across the channel width; the principal and one or more secondary paths being arranged such that charge spilling from the principal path fills the adjacent secondary paths in turn such that the minimum width of the parallel channel is used to transfer the charge.

11. A CCD imager according to claim 1, wherein a parallel channel is formed in a serial register.

12. A CCD imager according to claim 1, wherein the path defining structures are arranged such that in use signal charge generated across the entire width of a parallel channel is fed into the principal path from the secondary paths.

* * * * *